United States Patent [19]
Kim et al.

[11] Patent Number: 5,210,776
[45] Date of Patent: May 11, 1993

[54] COUNTER CIRCUIT FOR CONTROLLING AN ABSOLUTE POSITION OF A ROBOT SYSTEM

[75] Inventors: Sung-Kwon Kim, Seoul; Hak-Seo Oh, Kyonggi, both of Rep. of Korea

[73] Assignee: Samsung Electronics Co., Ltd., Suweon, Rep. of Korea

[21] Appl. No.: 774,305

[22] Filed: Oct. 10, 1991

[30] Foreign Application Priority Data

Oct. 12, 1990 [KR] Rep. of Korea ............... 90-16205

[51] Int. Cl.⁵ .................. H03K 21/40; G06M 3/02
[52] U.S. Cl. ................................. 377/17; 377/51
[58] Field of Search .............................. 377/17, 51

[56] References Cited

U.S. PATENT DOCUMENTS

| | | | |
|---|---|---|---|
| 3,832,640 | 8/1974 | Cederquist et al. | 377/51 |
| 3,922,670 | 11/1975 | Shaw et al. | 377/51 |
| 4,881,248 | 11/1989 | Korechika | 377/17 |
| 4,931,792 | 6/1990 | Baginski | 377/17 |
| 4,951,300 | 8/1990 | Koike | 377/17 |

Primary Examiner—John S. Heyman
Attorney, Agent, or Firm—Burns, Doane, Swecker & Mathis

[57] ABSTRACT

The present invention relates to a counter circuit for counting the rotated position of the motor and controlling absolute position of the same to control an absolute position of a robot system, which comprises, a RS-422 receiver for receiving encode signals from a motor driver, a 16-bit counter device for receiving rotated-number data of the motor supplied from the receiver and counting the data to output the counted value to a CPU via a bus line, a plurality of 4-bit counters for counting the signals when overflow or underflow is produced at the 16-bit counter portion, a first 8-bit latch circuit for receiving the counted values from the 4-bit counters and outputting the counted values to the CPU, and, a second 8-bit latch circuit for controlling the output state of the receiver on the basis of a control signal supplied through the bus line when a zero pulse control signal is inputted for searching an origin of the robot system thereby preventing erroneous counting operations due to a program and reducing the program porforming time.

9 Claims, 3 Drawing Sheets

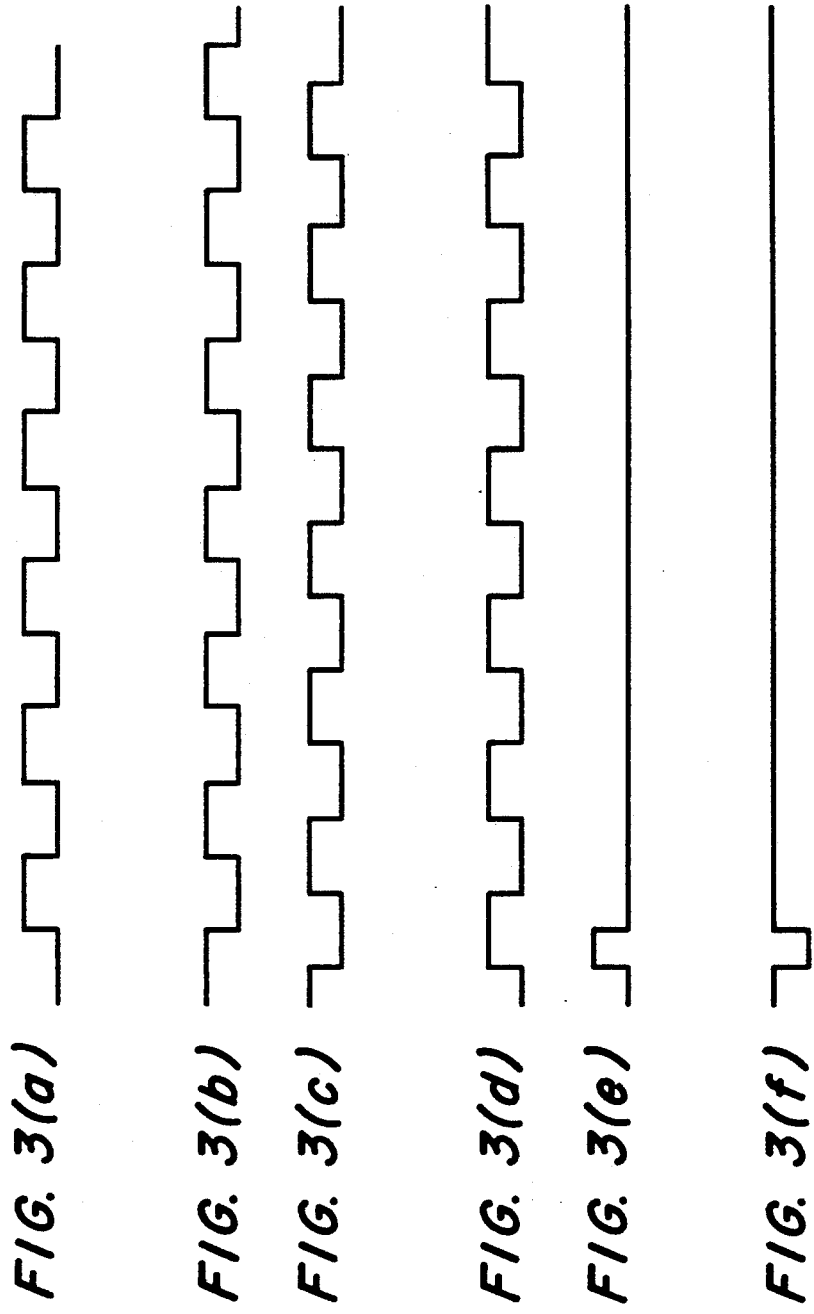

COUNTER CIRCUIT FOR CONTROLLING AN ABSOLUTE POSITION OF A ROBOT SYSTEM

BACKGROUND OF THE INVENTION

1. Field of the Invention

The present invention relates to a counter circuit for controlling an absolute position of a robot system, which counts a rotated position of a motor mounted in the robot system to control an absolute position of the motor so as to control the absolute position of the robot system.

2. Description of the Prior Art

A conventional counter circuit for controlling an absolute position of a robot system is constituted such that, as shown in FIG. 1, signals $CH_A$ and $CH_B$ produced from a motor (not shown) and encoded by an encoder (not shown) are supplied to and multiplied by 4 at a decoder 1. The output signals $CH_A$ and $CH_B$ thus multiplied are supplied as count pulse signals to an up/-down counter 2 which counts the count pulse signal. Simultaneously, the decoder 1 outputs at its output port UP/$\overline{DN}$ and up/down count output signal. Therefore, the counter 2 receives the count pulse signal and up/-down count signal through input ports CNT and UP/$\overline{DN}$ and counts in binary, the signals to produce 12-bit data. Then, the counter 2 outputs at its output port $Q_{11}$ the counted upper-bit value and at its output port $Q_0$ the counted lower-bit value to supply input ports $D_{11}$ to $D_0$ of a 12-bit latch circuit 3, respectively. Accordingly, the counted values are latched in the latch circuit 3 depending on a latch signal supplied from a central processing unit (hereinafter, refer to CPU), not shown. Therefore, the values then counted are supplied from output ports $D'_{11}$ to $D'_0$ toward the CPU via a data bus, so that the CPU controls the position of the motor on the basis of the counted value.

With the conventional count circuit constructed as mentioned above, however, only one revolution of the motor is counted with the use of a program, so that erroneous operations are undesirably caused. This results in inaccurate control of the motor.

SUMMARY OF THE INVENTION

Accordingly, the present invention has been made to avoid the problem of the prior art and an object of the present invention is to provide a counter circuit for controlling an absolute position of a robot system, which comprises a 24-bit counter for counting encoded signals inputted from a motor, thereby preventing erroneous counting operations due to a program and to reduce program performance time.

In order to achieve the aforementioned object, the present invention provides a counter circuit for controlling an absolute position of a robot system, the counter circuit comprising a RS-422 receiver for receiving encoded signals from a motor driver; a 16-bit counter means for receiving rotated-number data of the motor supplied from the receiver and counting the data to output the counted value to a CPU via a bus line; a plurality of 4-bit counters for counting the signals when overflow or underflow is produced at the 16-bit counter portion; a first 8-bit latch circuit for receiving the counted values from the 4-bit counters and outputting the counted values to the CPU; and, a second 8-bit latch circuit for controlling the output state of the receiver on the basis of a control signal supplied through the bus line when a zero pulse control signal is inputted for searching the starting point of the robot system.

DETAILED DESCRIPTION OF THE PREFERRED EMBODIMENT

Figure 1:
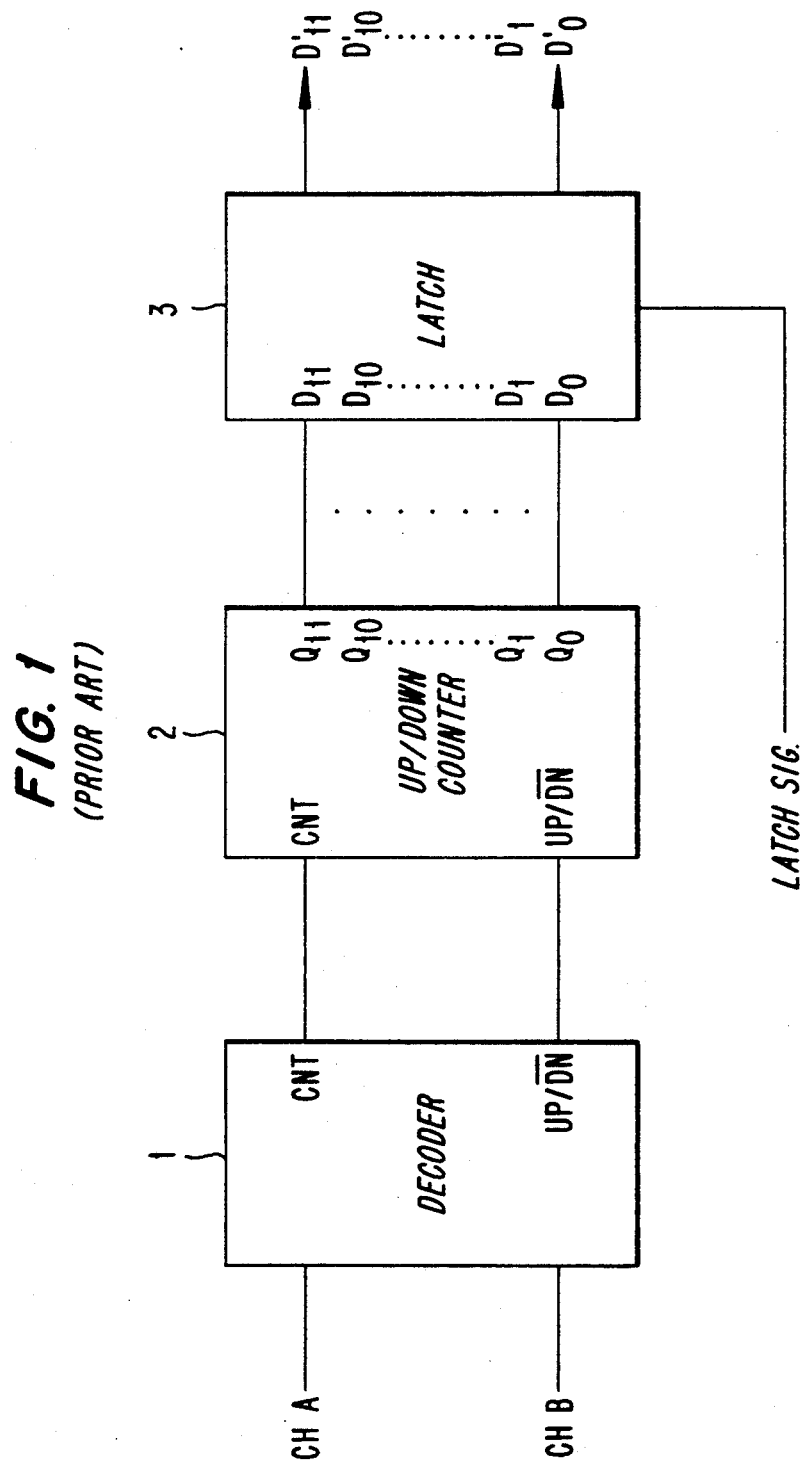
FIG. 1 is a block diagram of a conventional counter circuit for controlling an absolute position of a robot system.
Figure 2:
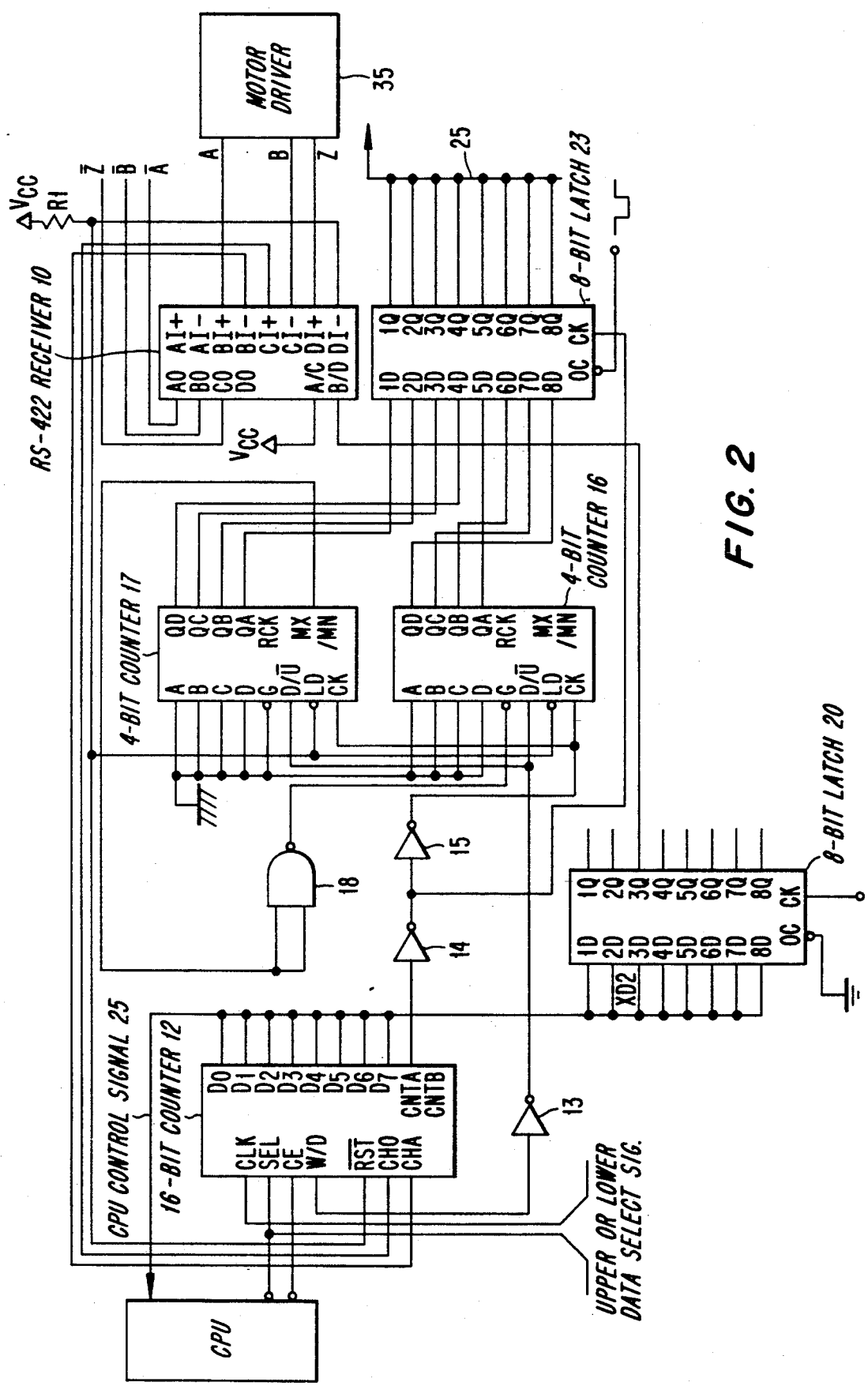
FIG. 2 is a block diagram of a counter circuit for controlling an absolute position of a robot system according to a preferred embodiment of the present invention; and, FIGS. 3(a) to 3(f) are waveform views showing encoded signals inputted from a motor driver to the counter circuit.

A preferred embodiment of the present invention will be now described in detail with reference to the accompanying drawings, in which FIG. 2 is a circuit diagram of a counter circuit for controlling an absolute position of a robot system according to the preferred embodiment of the present invention and FIGS. 3(a) to (f) are waveform views showing encoded signals supplied from a motor driver.

Referring to FIG. 2, numeral reference 10 denotes a RS-422 receiver for receiving the encoded signals supplied from the motor driver 35; 12 denotes a 16-bit counter portion for receiving the rotated number data of the motor supplied from the receiver and counting the data to output the counted value to a central processing unit (CPU)31 via bus line 25; 16 and 17 denote respectively a 4-bit counter portions for counting the encoded signal when overflow or underflow is generated at the counter portion 12. Also, numeral reference 23 denotes a first 8-bit latch circuit for receiving the counted values, that is, upper and lower-byte values from the 4-bit counters 16 and 17 and outputting the counted values to the CPU; 20 denotes a second 8-bit latch circuit for outputting a high-level signal to the receiver via the bus line 25 when a zero pulse control signal is inputted for searching an origin of the robot system at its initial start after it has been stopped.

In addition, numeral reference 14 denotes an inverter for inverting the output pulse from an output port CNTA of the counter portion 12 and outputting the inverted pulse to an input port CK of the first latch circuit 23; 15 denotes an inverter for reconverting the inverted pulse and supplying the reconverted pulse to the counter portions 16 and 17. Also, numeral reference 18 denotes a NAND circuit for inverting the pulse signal outputted from an output port MX/MN of the 4-bit counter portion 17 and supplying the inverted pulse signal to an input port G of the 4-bit counter portion 16 so as to count the upper-byte data.

Now, the operation and effect of the counter circuit according to the present invention constructed as mentioned above will be described in detail.

Firstly, the encoded signals A, B and Zp (shown in FIGS. 3 (a), (c) and (e)) are supplied from the motor driver 30 (see FIG. 2) to input ports B1+, C1+ and D1+ of the RS-422 receiver 10, respectively and the inverted signals $\overline{A}$, $\overline{B}$ and $\overline{Zp}$ (shown in FIG. 3 (b), (d) and (f)) of the encoded pulse $\overline{A}$, $\overline{B}$ and $\overline{Zp}$ are supplied to input ports A0, B0 and C0 of the receiver 10. In this case, the RS-422 receiver 10 outputs through output ports B1− and C1+ the encoded signals to supply the signals at input ports CHO and CHA of the 16-bit counter portion 12.

The counter portion 12 is connected at its input port $\overline{RST}$ to an output port D1 of the receiver and the power supply voltage Vcc through a pull up resistor R1.

Then, if a control signal for selecting the upper or lower data is supplied from the CPU 31 (see FIG. 2) to input ports SEL and CE of the counter portion 12 and a clock pulse is inputted to an input port CLK of the counter portion 12, the counter 12 counts the encoded signals inputted from the RS-422 receiver 10 and outputs the counted values from output ports D0 to D7 to the CPU via the bus line 25, so that the CPU controls the absolute position of the motor.

Meanwhile, if the overflow or underflow is generated at the counter 12 in counting, an up/down signal is outputted from an output port W/D of the counter 12 and inverted through an inverter 13, which is then inputted to the respective input port D/$\overline{U}$ of the 4-bit counters 16 and 17 serving as an up and down counter, respectively.

At this time, the counter 12 outputs a pulse signal through an output port CNTA. The pulse signal is inverted through the inverters 14 and 15 and then inputted to input ports CK and CK of the counters 16 and 17, respectively. Accordingly, the counters 16 and 17 count the inputted pulse signal in accordance with the up/down signal and output the counted value through output ports QA, QB, QC and QD to supply the same to input ports 1D to 8D of the 8-bit latch circuit 23.

Here, in counting up, the counter 12 outputs the pulse signal through the output port CNTA when the count has been completed from the maximum value OFFFFH to the minimum value 000000. In counting down, the counter 12 outputs the pulse signal through the output port CNTA when the count has been completed from the minimum value 000000 to the maximum value OFFFFH. Accordingly, the upper-byte counter starts to count at the rising edge of the output pulse from the output port W/D of the counter 12 and latches the counted value to the latch circuit 23 at the falling edge of the output pulse.

Moreover, when the counter 17 counts the lower 4-bit data of the up/down signal to reach the maximum value, one pulse signal is outputted from the counter 17. The pulse signal is inverted by the NAND circuit 18 and the inverted pulse signal is inputted to an input port G of the counter 16. Upon receiving the pulse signal, the counter 16 counts the upper 4-bit data of the up/down signal.

Then, the counted values of the counters 16 and 17 are supplied to the latch circuit 23. In this case, the latch circuit 23 latches the counted value when the output signal from the inverter 14 is inputted to an input port CK. And, if an output enable signal is inputted to an input port OC of the latch circuit 23, this circuit 23 outputs the latched values at its output ports 1Q to 8Q to the CPU via the bus line 25, so that the CPU analyses the values relative to the number of rotations of the motor inputted from the latch circuit 23 to control the absolute position of the motor.

More particularly, if the pulse outputted from the port CNTA of the counter 12 is inverted by the inverter 14 and supplied to the input port CK of the latch circuit 23, the values then counted by the counters 16 and 17 are latched to the latch circuit 23. Under this condition, if a low-level pulse is supplied from the CPU to the input port OC of the latch circuit 23, this circuit 23 outputs the latched value to the CPU via the bus line 25 connected to upper-byte data input ports of the CPU so as to control the absolute position of the robot system.

Meanwhile, if the zero pulse control signal and high-level signal XD are respectively inputted from the CPU to input ports CK and 3D of a 8-bit latch circuit 20, a high-level signal is outputted from an output port 3Q of the latch circuit 20. Under this condition, the signals Zp and $\overline{Zp}$ shown in FIGS. 3 (e) and (f) and supplied from the motor driver 35 are enabled so as to allow the value of the 12-bit counter 12 and 4-bit counters 16 and 17 to be set "zero".

After the count value of the counters 12, 16 and 17 have been set "zero", under the control of the CPU, the latch circuit 20 outputs at the output port 3Q a low-level signal to disable the zero pulse to thereby allow the counting of the normally rotated number of the motor and to control the absolute position of the robot system.

As described, the counter circuit of the present invention comprises a 24-bit counter arrangement having the 16-bit counter 12 for counting the encoded signal outputted from the motor driver and two 4-bit counters 16 and 17 for separately counting the upper and lower byte data of the encoded signal when the overflow or underflow is produced at the counter 12, thereby controlling the absolute position of the robot system.

Referring to FIG. 3, (a) denotes the encoded signal A supplied from the motor driver 35, (b) denotes the inverted signal A of the signal $\overline{A}$ in FIG. 3 (a), (c) denotes the encoded signal B (90° out of phase with the signal A), (d) denotes the inverted signal $\overline{B}$ of the signal B in FIG. 3 (c), (d) denotes view of the encoded signal Zp, and (d) denotes the inverted signal $\overline{Zp}$ of the signal Zp.

As described above, according to the counter circuit of the present invention, the encoded signals supplied from the motor driver are counted by the 24-bit counter arrangement comprising the 16-bit counter 12 and two 4-bit counters 16 and 17. Therefore, the error generating rate in the counter circuit of the present invention is reduced considerably over the prior art counter circuit by counting the encoded signals by using the program. This has a beneficial results in that the erroneous counting can be reliably prevented and the program performance time can be considerably reduced.

What is claimed is:

1. A counter circuit for controlling an absolute position of a robot system, the counter circuit comprising:
   receiver means for receiving encode signals from a motor driver;
   first counter means for receiving rotated-number data of the motor supplied from said receiver and counting data to output a first counted value to a central processing unit (CPU) via a bus means;
   second counter means for counting signals when overflow or underflow is produced at said first counter means and outputting a second counter value;
   a first latch circuit for receiving the second counted values from said second counter means and outputting the second counted values to said CPU; and,
   an origin generating means for controlling an output state of said receiver means on the basis of a control signal supplied through said bus means when a zero pulse control signal is inputted for searching an origin of said robot system.

2. The counter circuit according to claim 1, wherein said second counter means comprises two 4-bit counters and said first counter means comprises a 16-bit counter and wherein said 16-bit counter and said two 4-bit counters form a 24-bit counter arrangement.

3. The counter circuit according to claim 1, wherein said second counter means comprises a plurality of counters and one of said plurality of counters counts lower-bit data of said encode signals and another of said plurality of counters counts upper-bit data of said encode signals.

4. The counter circuit according to claim 1, wherein said origin pulse generating means for searching an origin of said robot system comprises a second latch circuit.

5. The counter circuit according to claim 1, wherein said receiver means comprises an RS-422 receiver.

6. A counter circuit for controlling an absolute position of a robot system, the counter circuit comprising:
   receiver means for receiving encode signals from a motor driver;
   first counter means for receiving said encode signals from said receiver and counting said signals to output a first counted value to a central processing unit (CPU);
   second counter means for counting signals when overflow or underflow is produced at said first counter means and outputting a second counter value;
   a first latch circuit for receiving the second counted values from said second counter means and outputting the second counted values to said CPU; and,
   an origin generating means for controlling an output state of said receiver means responsive to a control signal from said CPU when a zero pulse control signal is inputted for searching an origin of said robot system.

7. The counter circuit according to claim 6, wherein said second counter means comprises two 4-bit counters and said first counter means comprises a 16-bit counter and wherein said 16-bit counter and said two 4-bit counters form a 24-bit counter arrangement.

8. The counter circuit according to claim 6, wherein said second counter means comprises a plurality of counters and one of said plurality of counters counts lower-bit data of said encode signals and another of said plurality of counters counts upper-bit data of said encode signals.

9. The counter circuit according to claim 6, wherein said origin pulse generating means for searching an origin of said robot system comprises a second latch circuit.

* * * * *